(12) United States Patent
DeLaCruz

(10) Patent No.: US 9,263,409 B2
(45) Date of Patent: Feb. 16, 2016

(54) MIXED-SIZED PILLARS THAT ARE PROBEABLE AND ROUTABLE

(71) Applicant: eSilicon Corporation, San Jose, CA (US)

(72) Inventor: Javier DeLaCruz, Summit, NJ (US)

(73) Assignee: eSilicon Corporation, San Jose, CA (US)

( * ) Notice: Subject to any disclaimer, the term of this patent is extended or adjusted under 35 U.S.C. 154(b) by 0 days.

(21) Appl. No.: 14/283,108

(22) Filed: May 20, 2014

(65) Prior Publication Data

US 2014/0346513 A1  Nov. 27, 2014

Related U.S. Application Data

(60) Provisional application No. 61/825,984, filed on May 21, 2013.

(51) Int. Cl.
*H01L 23/48* (2006.01)
*H01L 23/00* (2006.01)
*G01R 31/28* (2006.01)

(52) U.S. Cl.
CPC ............ *H01L 24/14* (2013.01); *G01R 31/2884* (2013.01); *H01L 2224/1703* (2013.01); *H01L 2924/01029* (2013.01); *H01L 2924/1461* (2013.01)

(58) Field of Classification Search
CPC ............ H01L 2224/45013; H01L 24/14; H01L 2924/207; G01R 31/28
USPC ................................... 257/E21.508, E21.521
See application file for complete search history.

(56) References Cited

U.S. PATENT DOCUMENTS

| | | | |
|---|---|---|---|
| 6,551,844 B1 * | 4/2003 | Eldridge et al. | 438/14 |
| 7,400,134 B2 * | 7/2008 | Morishita | G01R 31/31701 257/48 |
| 7,902,666 B1 * | 3/2011 | Hsu | H01L 23/49838 257/734 |
| 8,207,608 B2 * | 6/2012 | Chew et al. | 257/738 |
| 8,723,052 B1 * | 5/2014 | Sullivan et al. | 174/266 |
| 2008/0283998 A1 * | 11/2008 | Choi et al. | 257/692 |
| 2011/0140105 A1 * | 6/2011 | Maruyama | H01L 22/32 257/48 |

OTHER PUBLICATIONS

English translation of Akiba JP2009-49170.*

* cited by examiner

*Primary Examiner* — John C Ingham
(74) *Attorney, Agent, or Firm* — Fenwick & West LLP

(57) ABSTRACT

An integrated circuit with probeable and routable interfaces is disclosed. The integrated circuit includes multiple micro-pillars that are attached to the surface of the integrated circuit, and multiple macro-pillars also attached to the surface of the integrated circuit. The micro-pillars provide an electrical interface to the integrated circuit during regular operation. The macro-pillars provide an electrical interface to the integrated circuit both during regular operation and during testing of the integrated circuit.

18 Claims, 9 Drawing Sheets

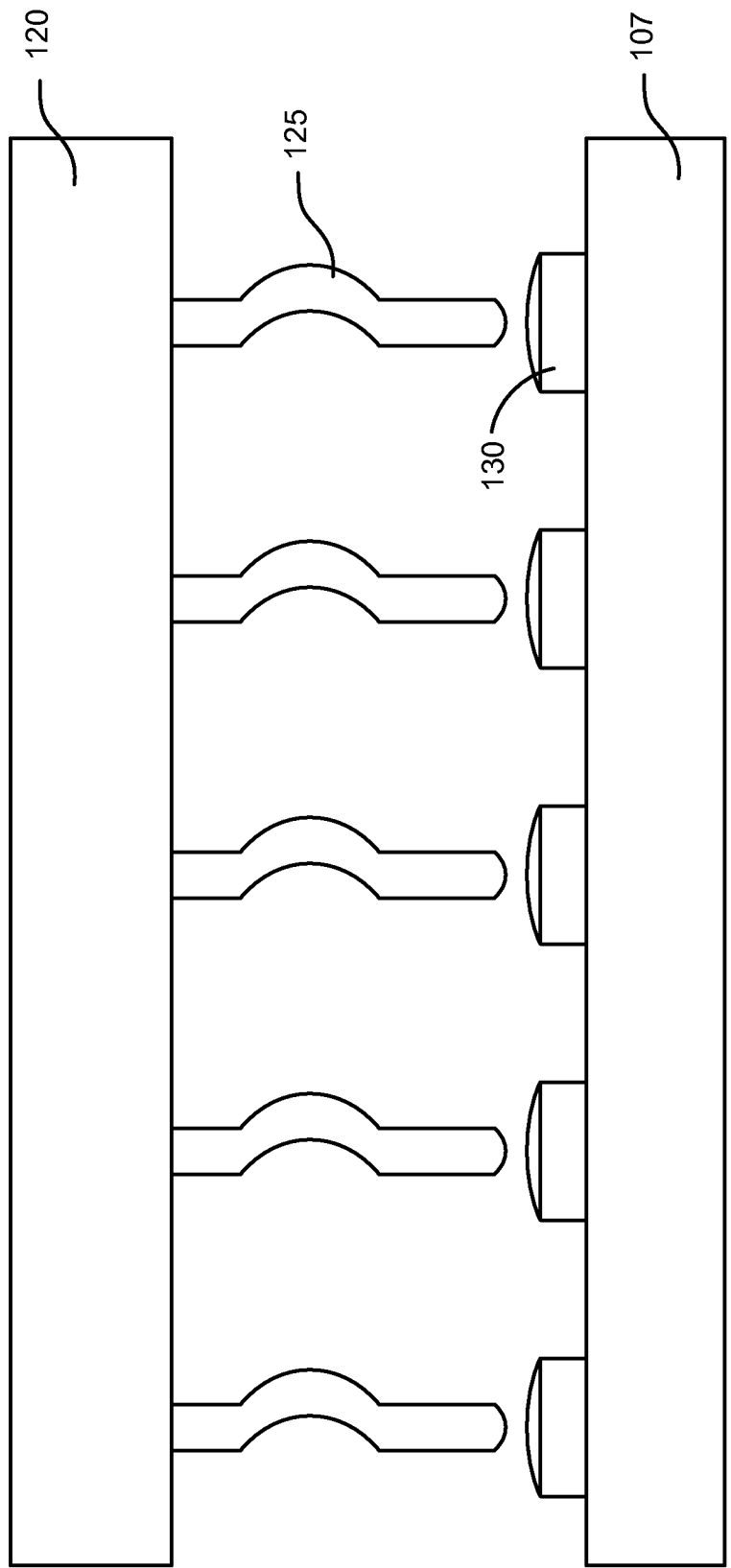

MIXED-SIZED PILLARS THAT ARE PROBEABLE AND ROUTABLE

CROSS REFERENCE TO RELATED APPLICATIONS

This application claims the benefit of U.S. Provisional Application No. 61/825,984, filed May 21, 2013, which is incorporated by reference in its entirety.

BACKGROUND OF THE INVENTION

1. Field of the Invention

This invention relates generally to integrated circuits. More particularly, it relates to probeable and routable interfaces for integrated circuits.

2. Description of the Related Art

Integrated circuits may interface to external circuitry using a number of different techniques. For example, a flip chip integrated circuit may interface to external circuitry using small solder balls attached to micro-pillars located on the integrated circuit. Integrated circuits may be tested before being packaged or bonded to other integrated circuits. However, as the micro-pillars become smaller in size, the cost for probing and testing the integrated circuit increases. Thus, there is a need for better approaches to the use of micro-pillars.

SUMMARY OF THE INVENTION

The present invention overcomes the limitations of the prior art by including larger diameter pillars (referred to as "macro"-pillars) which have similar heights as the smaller micro-pillars. During testing of the integrated circuit, the macro-pillars can be probed at a lower cost since they are larger than the micro-pillars. Since the macro-pillars have similar heights as the micro-pillars, they can be used not only for testability but also as an electrical interface to the integrated circuit during regular operation.

BRIEF DESCRIPTION OF THE DRAWINGS

The invention has other advantages and features which will be more readily apparent from the following detailed description of the invention and the appended claims, when taken in conjunction with the accompanying drawings, in which:

FIG. 1A is a cross sectional side view of an integrated circuit being probed with a probe card, according to one embodiment of the invention.

DETAILED DESCRIPTION OF THE PREFERRED EMBODIMENTS

Figure 1B:
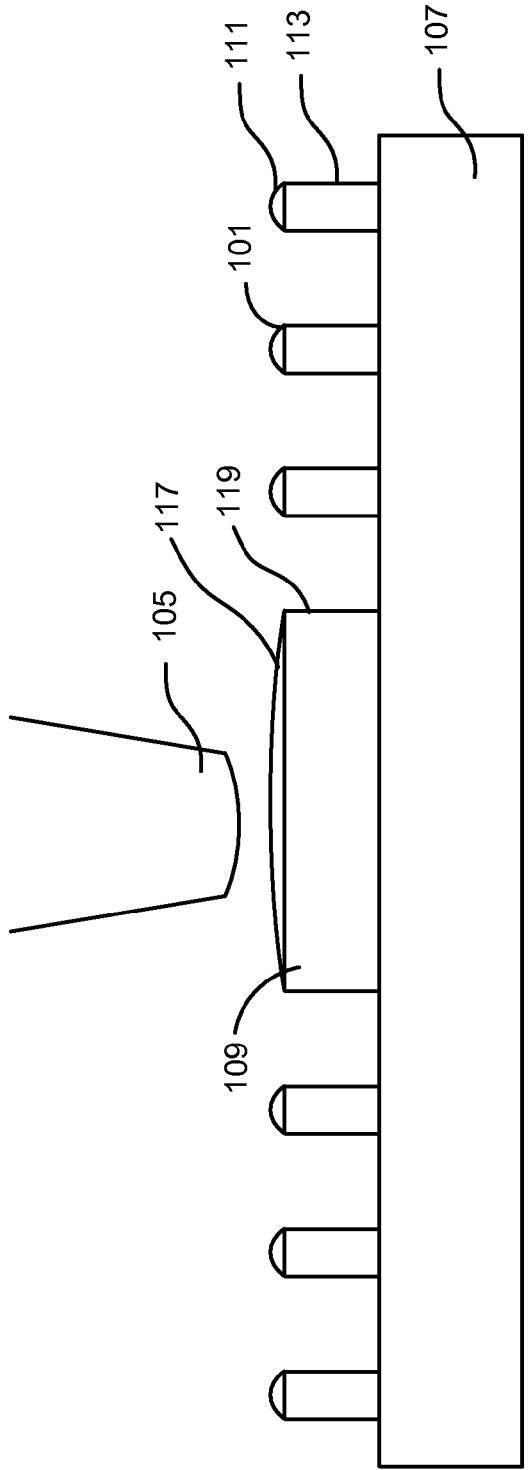
FIG. 1B is a cross sectional side view of an integrated circuit with macro-pillars and micro-pillars, shown during testing of the integrated circuit, according to one embodiment of the invention.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. Alternative embodiments of the structures and methods illustrated herein may be employed without departing from the principles described herein.

FIG. 1A illustrates an integrated circuit 107 being probed for testing, according to one embodiment of the invention. In the example of FIG. 1, integrated circuit 107 is being probed using a probe card 120. Probe card 120 is used to simultaneously probe multiple contacts 130 of the integrated circuit 107. Probe card 120 may, for example, be used to connect the integrated circuit 107 to a tester, such as an automated test equipment (ATE) (not shown).

The ATE sends signals to integrated circuit 107 and receives the outputs generated by integrated circuit 107, via the probe card 120. ATE may also compare the received output to an expected output and determine whether integrated circuit 107 is working properly. In some embodiments, ATE sends a power supply signal, a ground signal, and multiple test signals. Test signals may for example, be a digital signal or an analog signal.

Probe card 120 includes multiple probes 125. Each probe 125 is configured to provide electrical connection to a contact 130 of integrated circuit 107. Depending on the size of contacts 130, probes 125 may, for example, be needle probes, vertical probes, or micro electro-mechanical system (MEMS) probes.

Although in the example of FIG. 1A, a probe card 120 with five probes is used to test integrated circuit 107, any number of probe tips may be used for testing integrated circuit 107. In some embodiments, a probe card 120 tests one integrated circuit die. In other embodiments, a probe card 120 may test an entire wafer, or a portion of a wafer containing multiple integrated circuits 107.

The probe card and probe type used for testing a specific integrated circuit depends on the size of the contacts 130 of the integrated circuit 107. For instance, an integrated circuit 107 that has contacts 130 with a pitch of 80 µm may be tested using a probe card with vertical probes, whereas an integrate 107 that has contacts 130 with a pitch of 40 µm may be tested using a probe card with MEMS probes. As the dimension of contacts 130 reduces, the price of the probe card 120 and probes 125 used for testing integrated circuit 107 increases, increasing the price of integrated circuit 107.

In FIG. 1A, the contacts 130 are all the same size. They could be implemented as pillar-type contacts. As the number of contacts increases, the size of the contacts and the spacing between contacts will decrease. This would require a probe structure 120 that was similar in size and density to the pillars 130. Since the pillars 130 can be quite small and densely packed, such a probe device can be expensive to manufacture and maintain.

One alternative is to provide additional larger size test pads strictly for the purposes of testing. This technique reduces the cost of probing and testing the integrated circuit since the testing can be performed on the larger test pads using inexpensive equipment. However, the larger test pads take up space. In addition, because the test pads typically are flush with the surface of the integrated circuit, it is difficult to make electrical connections to both the test pads and to the pillar contacts. Therefore, the test pads cannot be easily used as an electrical interface to the integrated circuit.

FIG. 1B is a cross sectional side view of an integrated circuit 107 with both smaller size pillars 101 and larger size pillars 109, which will be referred to as micro-pillars and macro-pillars, respectively. The macro-pillars 109 have similar heights as the micro-pillars 101, but the macro-pillars 109 cover a larger area. Since the macro-pillars 109 are larger in area than the micro-pillars 101, they can be used to reduce the cost of testing the integrated circuit, as shown in FIG. 1B. Since the macro-pillars 109 have similar heights as the micro-pillars 101, they can also be used as an electrical interface to the integrated circuit 107, as shown in FIG. 2.

In FIG. 1B, a test probe 105 makes contact with the macro-pillar 109. This provides the electrical interface to test the integrated circuit. Since the macro-pillar 109 is larger than the micro-pillars 101, the test probe 105 can also be larger which makes it less expensive and more robust.

Figure 2:
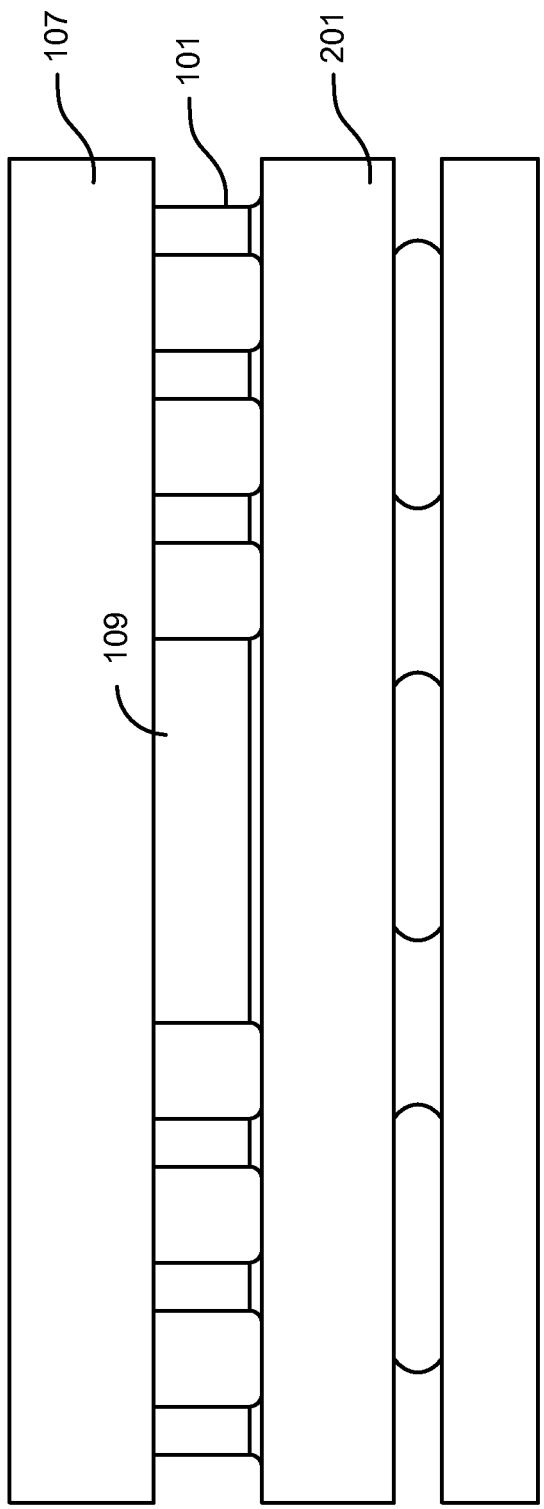
FIG. 2 is a cross sectional side view of the integrated circuit of FIG. 1, shown during operation of the integrated circuit, according to one embodiment of the invention.

In FIG. 2, the integrated circuit 107 is flip chip bonded to an external device 201 to create a composite integrated circuit structure. Examples of device 201 include other integrated circuits, in addition to interface structures such as interposers. Since the macro-pillars 109 have similar heights as micro-pillars 101, the macro-pillars 109 and micro-pillars 101 can all be used to provide electrical interfaces to the integrated circuit 107. The larger size of the macro-pillars 109 makes them especially suitable for certain types of interfaces, such as power distribution.

If the macro-pillars 109 are both probeable (i.e., used for testing) and routable (i.e., used as an electrical interface during regular operation), then the macro-pillars typically will be switchably connectable to different circuits on integrated circuit 107. Connection to one set of circuits will be made during testing (referred to as testing circuitry). Connection to another set of circuits will be made during regular operation (referred to as operational circuitry).

Figure 3A:
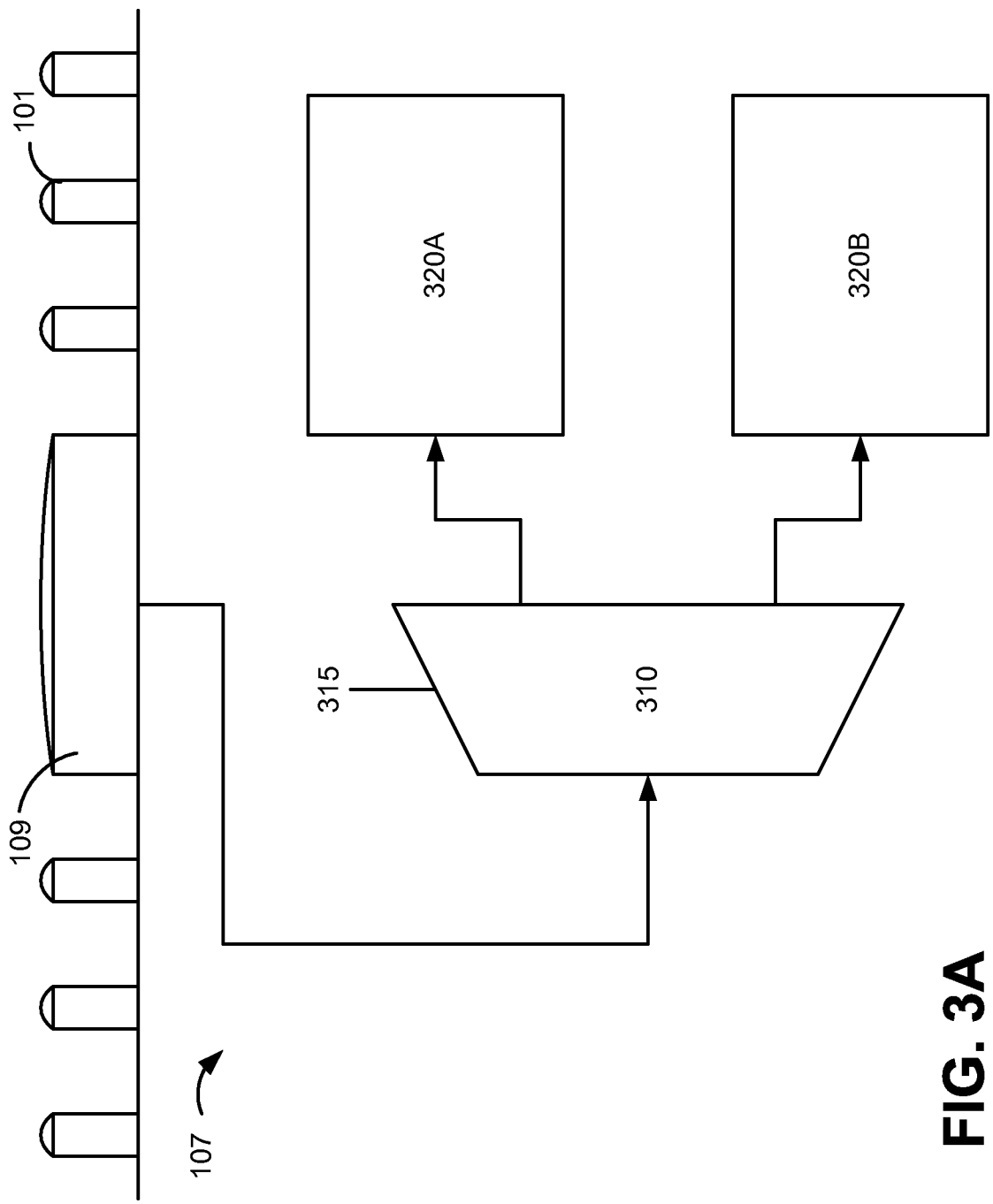
FIG. 3A is a diagram of an integrated circuit with a macro-pillar switchably connected to multiple circuits, according to one embodiment of the invention.

FIG. 3A illustrates a diagram of an integrated circuit 107 with a macro-pillar 109 that is switchably connected to multiple circuits of the integrated circuit 107, according to one embodiment of the invention. Integrated circuit 107 may include a switch 310 and multiple circuits 320A, 320B. In some embodiments, switch 310 may be a demultiplexer. Switch 310 receives a signal provided to the integrated circuit through macro-pillar 109 and routes the received signal to either circuit 320A or circuit 320B. In some embodiments, switch 310 may route the signal received through macro-pillar 109 to either circuit 320A or circuit 320B based on a circuit operation mode signal 315. For instance, circuit operation mode signal 315 may be set to a first value when the integrated circuit 107 is being tested, and may be set to a second value when the circuit is in regular operation.

In some embodiments, circuit operation mode signal 315 may be selected from more than two values. For instance, circuit operation mode signal 315 may be set to a first value when the integrated circuit 107 is in regular operation, a second value to connect macro-pillar 109 to a first test circuit, a third value to connect macro-pillar 109 to a second test circuit, and a fourth value to connect macro-pillar 109 to a third test circuit.

In some embodiments, the value of circuit operation mode signal 315 may be set during an initialization step of a test for circuit 107. In one embodiment, the circuit operation mode signal 315 may be received though a macro-pillar. The circuit operation mode signal 315 may, for example, be stored in a register. In another embodiment, a circuit operation mode detector circuit (not shown) may set the circuit operation mode signal 315 based on whether a signal received through a micro-pillar 101. For instance, if a signal is received through micro-pillar 101, circuit operation mode detector circuit may set the circuit operation mode signal 315 to regular operation. Alternatively, if a signal is not received through micro-pillar 101, the circuit operation mode detector circuit may set the circuit operation mode signal 315 to testing mode.

Macro-pillar 109 may be switchably coupled to multiple circuits 320A, 320B. Each circuit 320A, 320B may also be coupled to different micro-pillars 101 for independently interfacing each circuit 320A, 320B during normal operation. For instance, circuit 320A may be coupled to a first micro-pillar and circuit 320B may be coupled to a second micro-pillar. During testing of the integrated circuit 107, depending on the value of the circuit operation mode signal 315, either circuit 320A or circuit 320B may be interfaced through macro-pillar 109. Alternatively, during normal operation, circuit 320A may be interfaced through the first micro-pillar, and circuit 320B may be interfaced through the second micro-pillar.

Figure 3B:
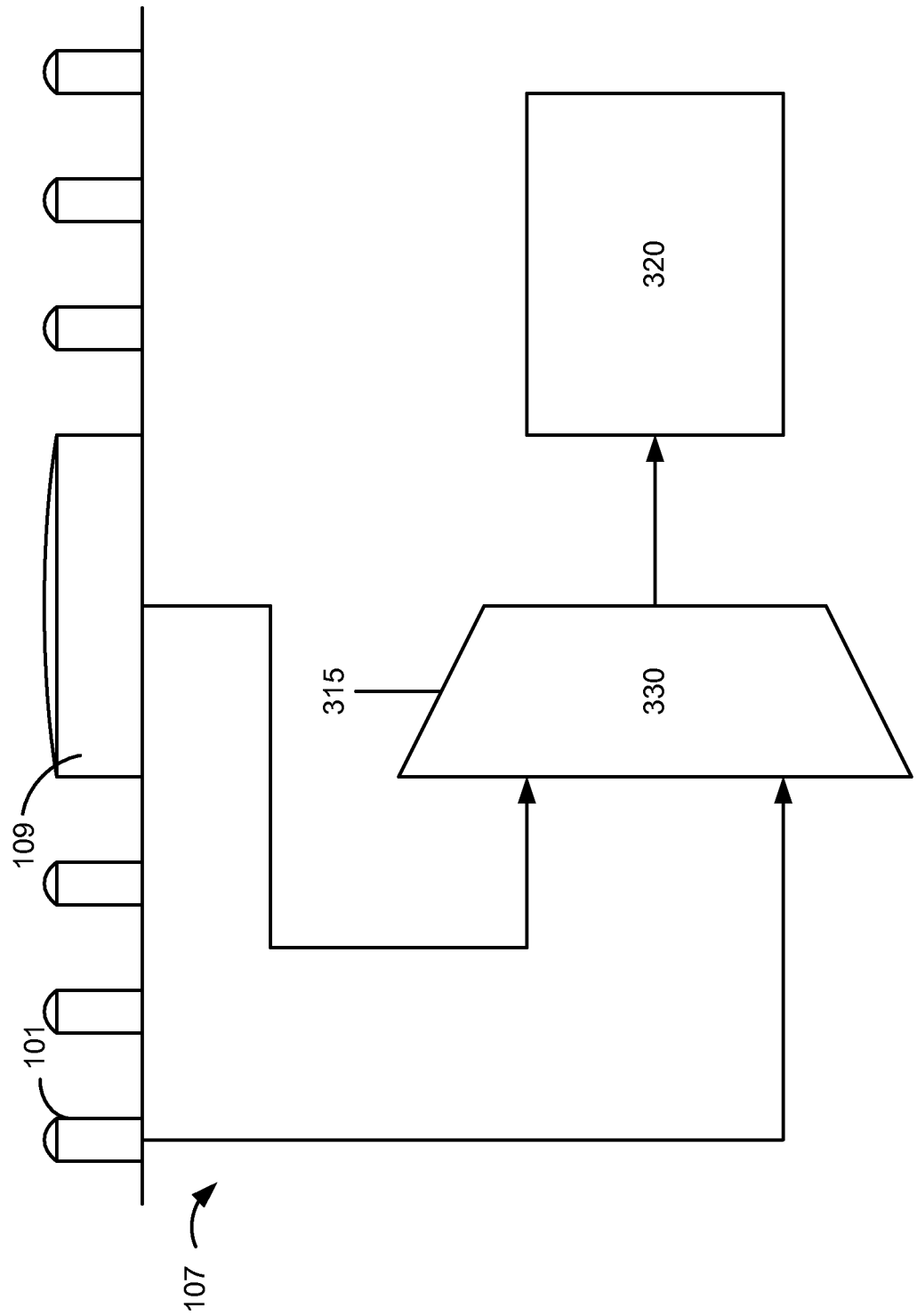
FIG. 3B is a diagram of an integrated circuit with a circuit switchably connected to a macro-pillar and a micro-pillar, according to one embodiment of the invention.

FIG. 3B illustrates a diagram of an integrated circuit 107 with a macro-pillar 109 and a micro-pillar 101 coupled to a selector 330, according to one embodiment of the invention. Selector 330 may select a signal for routing to circuit 320 based on a circuit operation mode signal 315. For instance, selector 315 may select a signal received through macro-pillar 109 when circuit operation mode signal 315 is set to a first value indicating the integrated circuit 107 is being tested, and may select a signal received through micro-pillar 101 when circuit operation mode signal 315 is set to a second value indicating the integrated circuit 107 is in normal operation.

In more detail, a micro-pillar 101 is a pillar-shaped structure that provides an electrical interface between an integrated circuit and an external circuit. In some embodiments, the micro-pillar 101 comprises a copper pillar 113 capped by a solder ball 111. The size of micro-pillars varies depending on the technology node being used. In some embodiments, micro-pillars may have a circular cross section. In other embodiments, micro-pillars may have an octagonal cross section. Embodiments of micro pillars may have an aspect ratio of 1 to 1 (height is equal to diameter). For example, a micropillar might be 20 µm in diameter and 20 µm in height. In some embodiments, a pillar-shaped structure is considered to be a micro-pillar if the diameter is smaller than 45 µm.

Macro-pillars 109 are similar to micro-pillars 101 but cover a larger area. If both the micro-pillars 101 and macropillars 109 are cylindrical, then they will have similar heights but the macro-pillars 109 will have larger diameters. For example, a macro-pillar might be 90 µm in diameter and 20 µm in height. Macro-pillars 109 may also comprise a copper post 119 capped by solder 117 (although it may not be a solder ball). Solder reflow techniques can be used to make connections to the solder portions of both the macro-pillars 109 and the micro-pillars 101. In some embodiments, micro-pillars 101 and macro-pillars 109 are designed to have similar heights after the reflow process. In some embodiments, the micro-pillars 101 and/or the macro-pillars 109 have a circular cross section. In other embodiments, the micro-pillars 101 and/or the macro-pillars 109 have an octagonal cross section. In yet other embodiments, the micro-pillars 101 and/or the macro-pillars 109 may have a cross section with any other geometrical shape, such as a square, a hexagon, and the like.

Since the rate of deposition and/or electroplating of the metal that forms micro-pillars 101 and macro-pillars 109 depends on the diameter of the pillars, in some cases, micro-pillars 101 and macro-pillars 109 are formed in two different steps. In one embodiment, the micro-pillars 101 are formed before forming the macro-pillars 109. In other embodiments, the macro-pillars 109 are formed before forming the micro-pillars 101. In yet other embodiments, if the rate of deposition and/or electroplating is the same, both micro-pillars and macro-pillars may be formed at the same time.

Figure 1C:
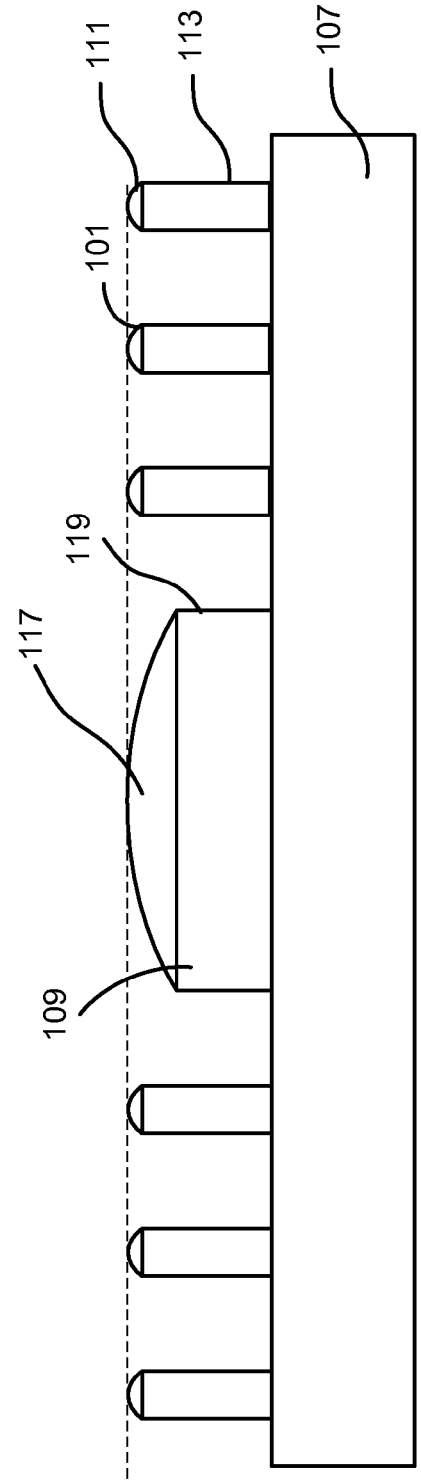
FIG. 1C is a cross sectional side view of an integrated circuit with macro-pillars and micro-pillars having the similar total height, according to one embodiment of the invention.

In some embodiments, as illustrated in FIG. 1C, copper pillars 113 of micro-pillars 101 are of different height than copper pillars 119 of macro-pillars 109 to compensate for a height difference of solder balls 111 of micro-pillars 101 and solder balls 117 of macro-pillars 109. The height of solder balls 111, 117 may depend on the diameter of micro-pillars 101 and macro-pillars 109. The height of copper pillars 113 and copper pillars 119 may be adjusted so that the total height of micro-pillars 101 and the total height of macro-pillars 109 are substantially equal.

For example, to form the micro-pillars 101 and macro-pillars 109 of integrated circuit 107, a photolithography step might first define the footprints of the micro-pillars 101. An electroplating process deposits a copper layer in the footprint areas, thus forming the micro-pillars 101. The masking material is removed and a second photolithography process then defines the footprints of the macro-pillars 109. A second electroplating process deposits a copper layer forming the macro-pillars 109.

In one embodiment, the macro-pillars 109 can be located anywhere on the surface of the integrated circuit 107. In other embodiments, the macro-pillars are confined to certain locations (e.g., to the center, or to the perimeter) of the integrated circuit 107.

Figure 4A:
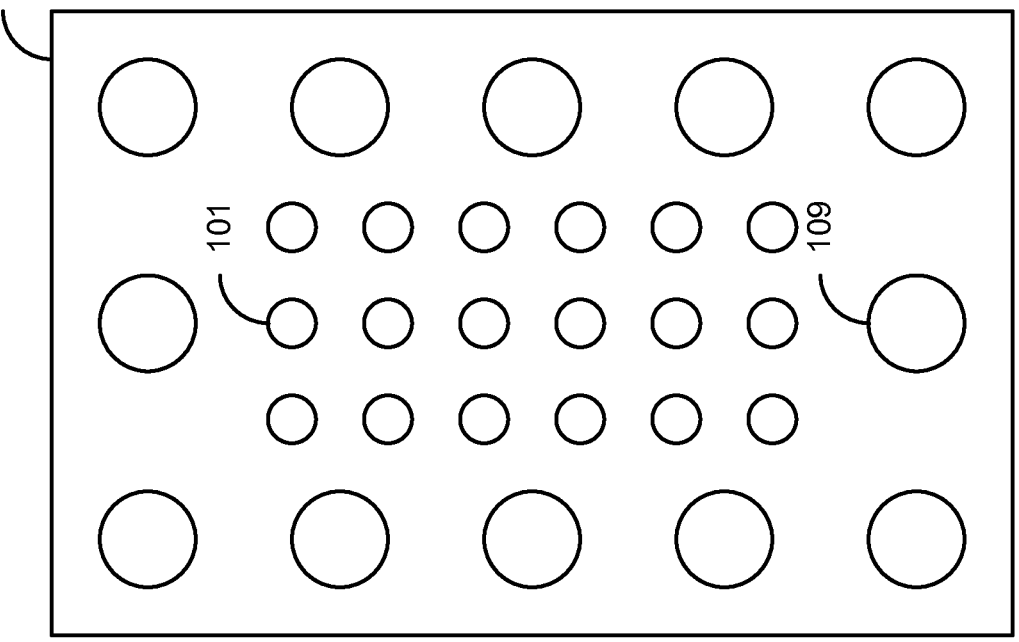
FIG. 4A is a top view of an integrated circuit with macro-pillars randomly arranged across the surface of the integrated circuit, according to one embodiment of the invention.

FIG. 4A-4D are top views showing different arrangements of macro-pillars and micro-pillars, according to different embodiments of the invention. In FIG. 4A, macro-pillars 109 are placed randomly across the surface of the integrated circuit 107.

Figure 4B:
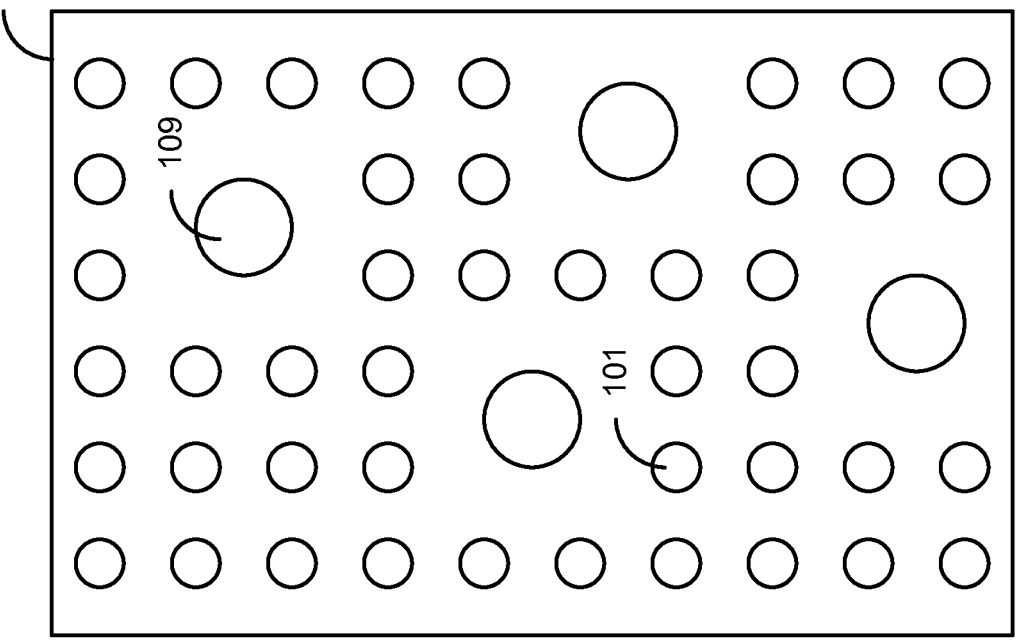
FIG. 4B is a top view of an integrated circuit with macro-pillars located around the perimeter of the integrated circuit, according to one embodiment of the invention.

In FIG. 4B, macro-pillars 109 are located around the perimeter of the integrated circuit 107. For example, core devices may be located in the center of the device and it may be beneficial to interface core devices with micro-pillars 101. For instance, micro-pillars 101 may add less parasitic capacitance, compared to macro-pillars, to the input of the circuit being interfaced. In addition, macro-pillars that are located in the perimeter of the integrated circuit may be used to connect power supply and ground signals.

Figure 4D:
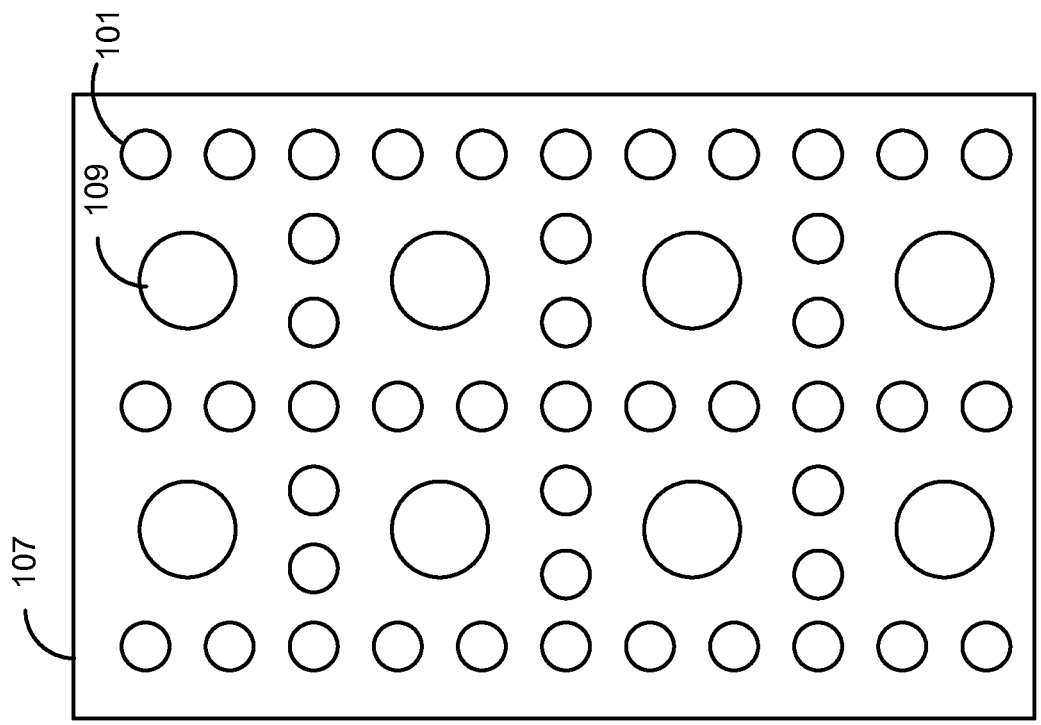
FIG. 4D is a top view of an integrated circuit with macro-pillars periodically arranged across the surface of the integrated circuit, and with micro-pillars interspersed between macro-pillars, according to one embodiment of the invention.
Figure 4C:
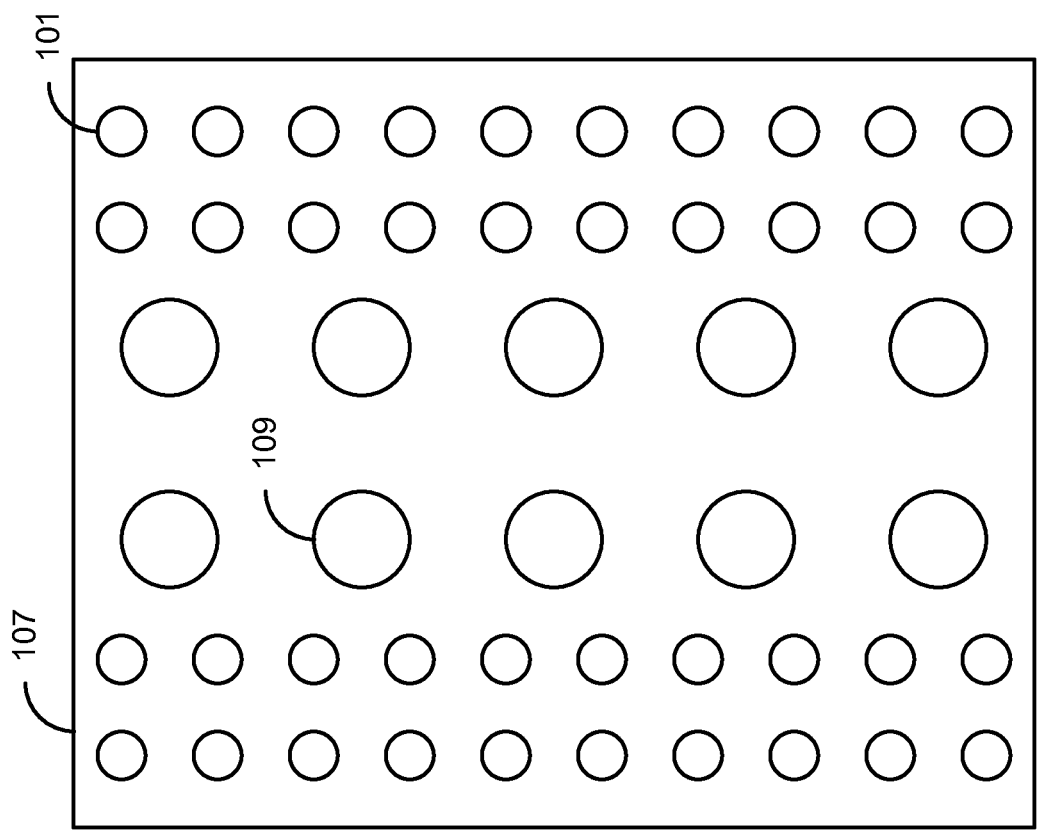
FIG. 4C is a top view of an integrated circuit with macro-pillars located in a center region of the integrated circuit, according to one embodiment of the invention.

In FIG. 4C, macro-pillars 109 are located in a center region of the integrated circuit 107. For example, the configuration of FIG. 4C might be used if core devices to be tested are located in the center region and I/O devices that require less or no testing are located around the perimeter of the integrated circuit 107.

In FIG. 4D, macro-pillars 109 are periodically arranged across the surface of the integrated circuit 107, and micro-pillars 101 are interspersed between the macro-pillars. For instance, macro-pillars 109 may be spread across the surface of the integrated circuit 107 based on a pitch of the probe card that will be used for testing the integrated circuit. Since micro-pillars 101 can have a smaller pitch than macro-pillars 109, one or more micro-pillars may be placed between two macro-pillars 109, where otherwise there would be an empty space.

In some embodiments, the location of the macro-pillars 109 is determined based on available probe cards that can be used to test the integrated circuit 107. In other embodiments, the location of the macro-pillars might be determined by the integrated circuit fabrication facility to increase the manufacturability and/or the mechanical properties of the integrated circuit 107.

Figure 5A:
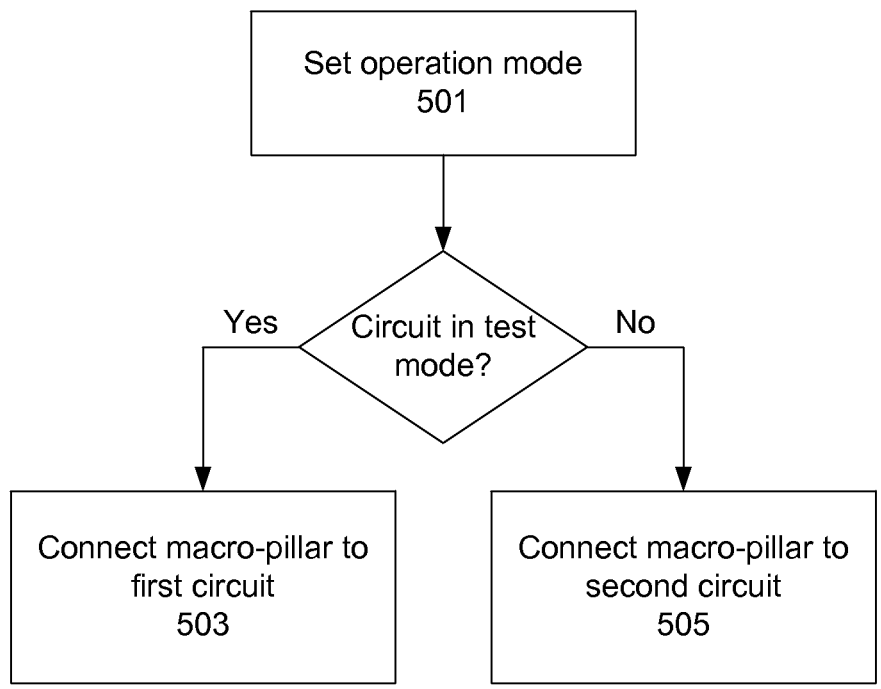
FIG. 5A is a flow diagram of a process for operating an integrated circuit, according to one embodiment of the invention.

FIG. 5A illustrates a flow diagram of a process for operating an integrated circuit (such as shown in FIG. 3A), according to one embodiment of the invention. An operation mode for the integrated circuit 107 is set 501. For instance, the operation mode may indicate that the integrated circuit is in test mode or normal operation mode. If the operation mode indicates that the integrated circuit is being operated in test mode, macro-pillar 109 is connected 503 to a first circuit 320A used for testing. The first circuit may, for example, be a test circuit. If the operation mode indicates that the integrated circuit is being operated in normal operation mode, macro-pillar 109 is connected 505 to a second circuit 320B used for normal operation.

Figure 5B:
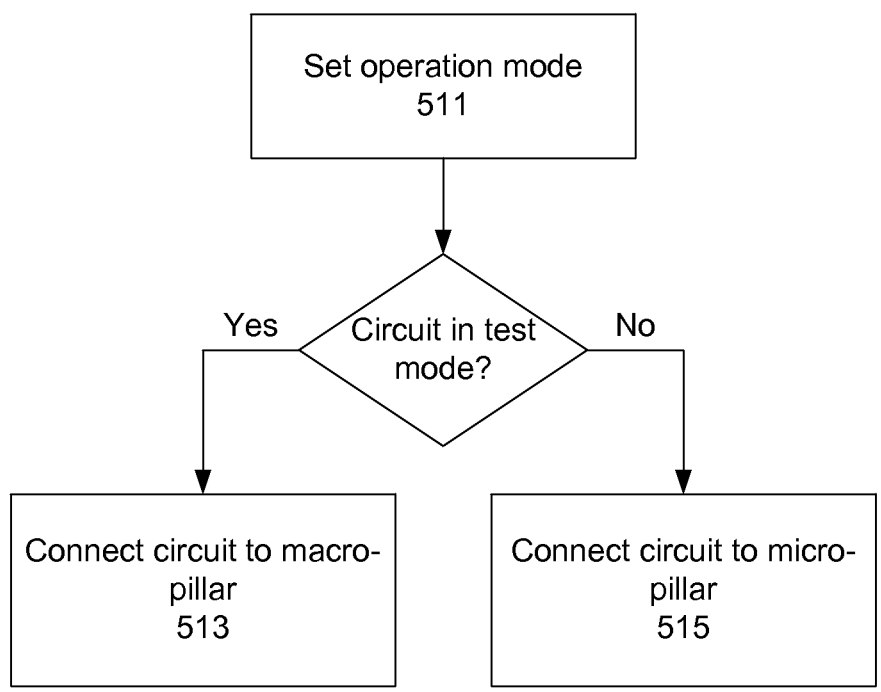
FIG. 5B is a flow diagram of a process for interfacing a circuit of an integrated circuit, according to one embodiment of the invention.

FIG. 5B illustrates a flow diagram of a process for interfacing a circuit of an integrated circuit (such as shown in FIG. 3B), according to one embodiment of the invention. An operation mode for the integrated circuit 107 is set 511. If the operation mode indicates that the integrated circuit is being operated in test mode, circuit 320 is connected 513 to a macro-pillar 109. If the operation mode indicates that the integrated circuit is being operated in normal operation mode, circuit 320 is connected 515 to micro-pillar 101.

Figure 6:
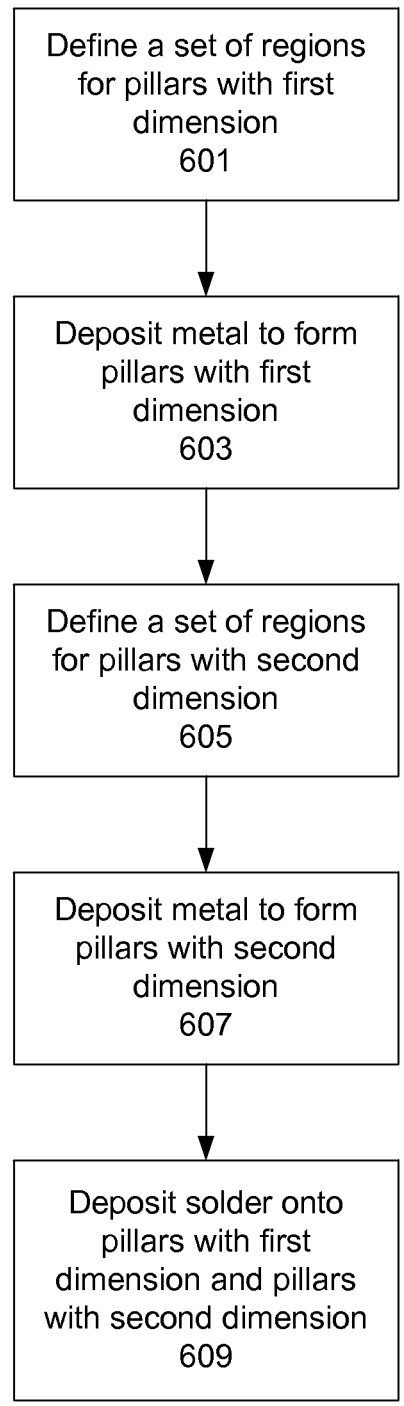
FIG. 6 is a flow diagram of a fabrication process for fabricating an integrated circuit with macro-pillars and micro-pillars, according to one embodiment of the invention.

FIG. 6 is a flow diagram of a process for fabricating an integrated circuit with macro-pillars and micro-pillars, according to one embodiment of the invention. A first set of regions for forming pillars with a first dimension is defined 601 on integrated circuit 107. The regions may be formed using a photolithographic process. Metal is deposited 603 on the defined first set of regions to form pillars with first dimension. In one embodiment, the metal deposition process may be an electroplating process. In other embodiments, other metal deposition process, such as vapor metal deposition, metal sputter deposition, may be used to form the pillars.

A second set of regions for forming pillars with a second dimension is defined 605 on integrated circuit 107. Metal is deposited 607 on the defined second set of regions to form pillars with second dimension. In some embodiments, pillars with first dimension are macro-pillars 107 and pillars with second dimension are micro-pillars 101. In other embodiments, pillars with first dimension are micro-pillars 101 and pillars with second dimension are macro-pillars 107. Solder is deposited 609 onto pillars with first dimension and pillars with second dimension.

Although the detailed description contains many specifics, these should not be construed as limiting the scope of the invention but merely as illustrating different examples and aspects of the invention. It should be appreciated that the scope of the invention includes other embodiments not discussed in detail above. Various modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

What is claimed is:

1. An integrated circuit operable in either a test mode or a normal operation mode, the integrated circuit comprising:
   a plurality of micro-pillars attached to a surface of the integrated circuit, the micro-pillars comprising copper pillars capped by solder;
   a plurality of macro-pillars also attached to the surface of the integrated circuit, the macro-pillars comprising copper pillars capped by solder, each macro-pillar covering a larger area than each micro-pillar, wherein the macro-pillars and the micro-pillars have substantially similar heights; and
   the macro-pillars and the micro-pillars providing an electrical interface to the integrated circuit, responsive to the integrated circuit being in normal operation mode; and
   the macro-pillars providing an electrical interface to the integrated circuit, responsive to the integrated circuit being in test mode.

2. The integrated circuit of claim 1, wherein the copper pillars of the micro-pillars and the copper pillars of the macro-pillars are formed by electroplating.

3. The integrated circuit of claim 1, wherein the copper pillars of the micro-pillars are formed independently of the copper pillars of the macro-pillars.

4. The integrated circuit of claim 1, further comprising:
   a switch, one of the macro-pillars coupled to the switch, the switch configured to couple the macro-pillar to a first circuit of the integrated circuit responsive to the integrated circuit being in test mode and to couple the macro-pillar to a second circuit of the integrated circuit responsive to the integrated circuit being in normal operation mode.

5. The integrated circuit of claim 1, further comprising:
   a selector having two inputs, one of the macro-pillars coupled to one of the inputs and one of the micro-pillars coupled to the other of the inputs, the selector configured to couple the macro-pillar to a first circuit of the integrated circuit responsive to the integrated circuit being in test mode and to couple the micro-pillar to the first circuit of the integrated circuit responsive to the integrated circuit being in normal operation mode.

6. The integrated circuit of claim 1 wherein the micro-pillar has a diameter smaller than 45 μm.

7. The integrated circuit of claim 1 wherein the macro-pillar has a diameter greater than 90 μm.

8. The integrated circuit of claim 1, wherein the macro-pillars are probeable using a vertical probe card.

9. The integrated circuit of claim 1, wherein the plurality of macro-pillars and the plurality of micro-pillars are randomly arranged across the surface of the integrated circuit.

10. The integrated circuit of claim 1, wherein the plurality of macro-pillars are arranged around a perimeter of the surface of the integrated circuit.

11. The integrated circuit of claim 1, wherein the plurality of macro-pillars are arranged in a central region of the surface of the integrated circuit.

12. The integrated circuit of claim 1, wherein the plurality macro-pillars are periodically arranged across the surface of the integrated circuit, and at least one or more micro-pillars from the plurality of micro-pillars are arranged in between two macro-pillars of the plurality of macro-pillars.

13. The integrated circuit of claim 1, wherein at least one of the plurality of macro-pillars is for supplying power to the integrated circuit.

14. A composite integrated circuit structure comprising:
   an integrated circuit having a first surface, with a plurality of micro-pillars and a plurality of macro-pillars attached to the first surface, the macro-pillars switchably connectable to testing circuitry on the integrated circuit; and
   a device having a second surface, the micro-pillars and macro-pillars contacting the second surface, the micro-pillars and macro-pillars configured to provide an electrical interface between the integrated circuit and the device.

15. The composite integrated circuit structure of claim 14, wherein the device is a silicon interposer, and wherein the silicon interposer comprises a first plurality of contact pads and a second plurality of contact pads, each contact pad of the second plurality of contact pads covering a larger area than each contact pad from the first plurality of contact pads.

16. The composite integrated circuit structure of claim 14, wherein the device is configured to have a third surface, the third surface configured to provide an electrical interface between the device and a printed circuit board.

17. The composite integrated circuit structure of claim 14, wherein the plurality of micro-pillars and the plurality of macro-pillars of the integrated circuit are used for flip chip bonding the integrated circuit to the device.

18. A method for manufacturing an integrated circuit, the method comprising:
   defining a first set of regions with a first dimension;
   depositing metal on the defined first set of regions to form a first set of pillars with the first dimension;
   after depositing metal on the defined first set of regions:
      defining a second set of regions with a second dimension, the second dimension different than the first dimension, and
      depositing metal on the defined second set of regions to form a second set of pillars with the second dimension; and
   depositing metal on the first set of pillars and the second set of pillars.

* * * * *